(12) United States Patent
Yamazaki et al.

(10) Patent No.: US 7,449,724 B2
(45) Date of Patent: Nov. 11, 2008

(54) LIGHT-EMITTING DEVICE

(75) Inventors: Shunpei Yamazaki, Setagaya (JP);
Ryoji Nomura, Yamato (JP); Akihisa Shimomura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/935,273

(22) Filed: Sep. 8, 2004

(65) Prior Publication Data

US 2005/0056856 A1 Mar. 17, 2005

(30) Foreign Application Priority Data

Sep. 12, 2003 (JP) ............... 2003-322280

(51) Int. Cl.
*H01L 33/00* (2006.01)
(52) U.S. Cl. ............... 257/98; 257/99; 257/E51.035; 257/E51.042; 257/E51.043; 257/E51.49; 372/87; 372/88
(58) Field of Classification Search ............. 257/98–99; 372/87–88
See application file for complete search history.

(56) References Cited

U.S. PATENT DOCUMENTS

| | | | |
|---|---|---|---|
| 5,623,181 A | | 4/1997 | Suehiro et al. |
| 5,834,893 A | * | 11/1998 | Bulovic et al. ............. 313/506 |
| 6,091,195 A | | 7/2000 | Forrest et al. |
| 6,631,147 B2 | | 10/2003 | Taniguchi et al. |
| 6,641,287 B2 | | 11/2003 | Suehiro |
| 2001/0051207 A1 | * | 12/2001 | Yamagata et al. ............. 427/58 |
| 2002/0021266 A1 | * | 2/2002 | Koyama et al. ............... 345/76 |
| 2002/0063515 A1 | | 5/2002 | Goto |
| 2002/0101157 A1 | * | 8/2002 | Suehiro ....................... 313/512 |
| 2003/0057417 A1 | * | 3/2003 | Lee et al. ....................... 257/40 |
| 2003/0058210 A1 | | 3/2003 | Yamazaki et al. |

(Continued)

FOREIGN PATENT DOCUMENTS

JP 9-190883 * 7/1997

(Continued)

OTHER PUBLICATIONS

Nir Tessler, "Lasers Based on Semiconducting Organic Materials," Adv. Mater. 1999, 11, No. 5, pp. 363-370.

*Primary Examiner*—Ahmed Sefer
(74) *Attorney, Agent, or Firm*—Eric J. Robinson; Robinson Intellectual Property Law Office, P.C.

(57) ABSTRACT

A light-emitting device is disclosed as typified by a laser oscillator formed by an electroluminescent material with improved oscillation efficiency of laser light and even reduced power consumption. The disclosed light-emitting device comprises a light-emitting element including a first electrode having a concave portion, an electroluminescent layer serving as a laser medium formed over the first electrode so as to be overlapped with the concave portion, and a second electrode formed over the electroluminescent layer so as to be overlapped with the concave portion, wherein light generated in the electroluminescent layer is resonated between the first electrode and the second electrode and emitted as laser light from the second electrode, an optical axis of the laser light intersects with the second electrode, the first electrode has a curved surface at the concave portion, and a center of curvature of the curved surface is located at the side of the second electrode above the first electrode.

7 Claims, 14 Drawing Sheets

U.S. PATENT DOCUMENTS

| | | |
|---|---|---|
| 2003/0103537 A1 | 6/2003 | Taniguchi et al. |
| 2004/0000673 A1 | 1/2004 | Murakami |
| 2004/0140765 A1 | 7/2004 | Takemura |
| 2005/0058162 A1* | 3/2005 | Nomura et al. ............... 372/9 |
| 2005/0069012 A1* | 3/2005 | Shimomura et al. ........... 372/87 |
| 2005/0116631 A1* | 6/2005 | Kim et al. .................... 313/506 |

FOREIGN PATENT DOCUMENTS

| | | |
|---|---|---|
| JP | 11-045453 | 2/1999 |
| JP | 2000-156536 | 6/2000 |
| JP | 2002-208491 | 7/2002 |
| JP | 2003-017273 | 1/2003 |

* cited by examiner

LIGHT-EMITTING DEVICE

BACKGROUND OF THE INVENTION

1. Field of the Invention

The present invention relates to a light-emitting device including an electroluminescent material.

2. Related Art

A semiconductor laser has advantages of being extremely manufactured into a small-sized and lightweight laser oscillator compared with another gas laser or solid laser. A semiconductor laser has been put to practical use in various fields as an light source for transmitting and receiving signals by means of an optical interconnection in an optical integrated circuit; for recording on an optical disk, optical memory, or the like; for optical communication with an optical fiber as a light guide. The oscillation wavelength of a semiconductor laser has the wide range of blue to infrared. Most oscillation wavelengths of generally used semiconductor lasers are in an infrared region such as a GaAs laser (wavelength 0.84 μm), an InAs laser (wavelength 3.11 μm), an InSb laser (wavelength 5.2 μm), a GaAlAs laser (wavelength 0.72 to 0.9 μm), or an InGaAsP (wavelength 1.0 to 1.7 μm).

In recent years, research on the practical application of a semiconductor laser with an oscillation wavelength in a visible region has been intensified. A laser oscillator (organic semiconductor laser) that can produce laser oscillation including an electroluminescent material that can generate luminescence (electroluminescence) by being applied with an electric field has been attracted attention. Such an organic semiconductor laser can emit a visible light wavelength, and can be manufactured over a glass substrate at low cost. Accordingly, such an organic semiconductor laser is expected to be used for various purposes.

An organic semiconductor laser with a peak length λ at 510 nm is disclosed in unexamined patent publication No. 2000-156536 (p. 11).

In order to obtain stimulated emission from an organic semiconductor layer, strong energy that can make a population inversion (pumping energy) is required to be provided to an electroluminescent layer that serves as a laser medium. Specifically, pumping energy can be provided by applying a forward bias voltage to an anode and a cathode to supply a current to the electroluminescent layer interposed between the anode and the cathode. To produce laser oscillation practically, it is inadequate only to make a population inversion. It is required that a required pumping energy exceeds its threshold value to be provided to an electroluminescent layer that serves as a laser medium at the start of oscillation, so that stimulated emission exceeds all of internal losses such as absorption in a resonator.

Oscillation efficiency of laser light for the provided energy (electricity) becomes higher with decreasing pumping energy that is required at the start of oscillation, accordingly, power consumption can be reduced. Therefore, it has been expected an organic semiconductor laser that can improve oscillation efficiency of laser light with controlling pumping energy to be provided. Especially, the demand for high oscillation efficiency of laser light is increasing in the field where power consumption is directly linked to the commercial value.

SUMMARY OF THE INVENTION

In view of the foregoing, it is an object of the present invention to provide a light-emitting device as typified by a laser oscillator, formed by an electroluminescent material that can improve oscillation efficiency of laser light and reduce power consumption.

The inventors considered that, the threshold value of the pumping energy that is required at the start of oscillation can be reduced by forming a reflector for reflecting stimulated emission to have a curvature in order to suppress diffraction losses in an optical resonator, as a result, the oscillation efficiency of an organic semiconductor laser can be accordingly improved.

According to one aspect of the present invention, a light-emitting device comprises a light-emitting element including a first electrode with a concave portion; an electroluminescent layer serving as a laser medium formed over the first electrode so as to be overlapped with the concave portion; and a second electrode formed over the electroluminescent layer so as to be overlapped with the concave portion; wherein light generated in the electroluminescent layer is resonated between the first electrode and the second electrode, and emitted as laser light from the second electrode; an optical axis of the laser light intersects with the second electrode; the first electrode has a curved surface at the concave portion; and a center of curvature of the curved surface is located at the second electrode side, that is, a distance of the first electrode to the center of curvature is longer than that of the first electrode to the second electrode.

Either the first electrode or the second electrode is an anode, and another is a cathode. The electroluminescent layer comprises at least a light-emitting layer. The electroluminescent layer may comprise a hole injecting layer, a hole transporting layer, and the like between the light-emitting layer and the anode; and an electron injecting layer, an electron transporting layer, and the like between the light-emitting layer and the cathode. In this instance, all of layers including the light-emitting layer provided between the anode and the cathode are referred to as an electroluminescent layer. Inorganic compounds may be contained in the layers composing the electroluminescent layer.

In the foregoing light-emitting device, the first electrode and the second electrode are used as reflectors for resonating light. However, the invention is not limited thereto. For example, besides the light-emitting element, a reflector having a concave portion may be separately provided to resonate light generated in the electroluminescent layer by the reflector and either the first electrode or the second electrode. Layers other than the light-emitting layer such as the hole injecting layer, the hole transporting layer, the electron injecting layer, the electron transporting layer, and the like may reflect light generated in the light-emitting layer to form an optical resonator.

The optical resonator included in a light-emitting device according to the invention may be a half-spherical resonator in which either two reflectors has a curved surface and another has a plane surface; or a confocal resonator, a concentric resonator, or a spherical resonator in which two reflectors have curved surfaces. According to the invention, a stable resonator can be formed by controlling the radius of curvature r and the length of the resonator L in order to suppress a diffraction loss.

Contrary to an organic semiconductor laser, a semiconductor laser including single crystalline semiconductor is difficult in manufacturing an electrode serving as a reflector to have a curved surface, and an activation region that is a laser medium over the reflector with a curved surface. In case that a reflector having a curved surface that is separately formed is installed to the semiconductor laser after forming an activation region that is a laser medium, the position control of two reflectors and the activation region is required to be carried out on the order of several ten nm, accordingly, a manufacturing process becomes complicated. However, in case of an organic semiconductor laser, it is easier that an electrode serving as a reflector is formed to have a curved surface, and that a light-emitting element is formed over the reflector with a curved surface compared with a semiconductor laser. Therefore, the position control of two reflectors and the activation region can be carried out comparatively easily on the order of several ten nm by a thickness of each layer.

According to the invention, contrary to a semiconductor laser including single crystalline semiconductor, a laser oscillator that is a stable resonator having two reflectors, either of which has a curved surface, can be comparatively easily manufactured by using a light-emitting element. Further, oscillation efficiency can be improved by the stable resonator and high luminance laser light can be obtained at low power consumption.

These and other objects, features and advantages of the present invention will become more apparent upon reading of the following detailed description along with the accompanied drawings.

DESCRIPTION OF THE INVENTION

Figure 1A:
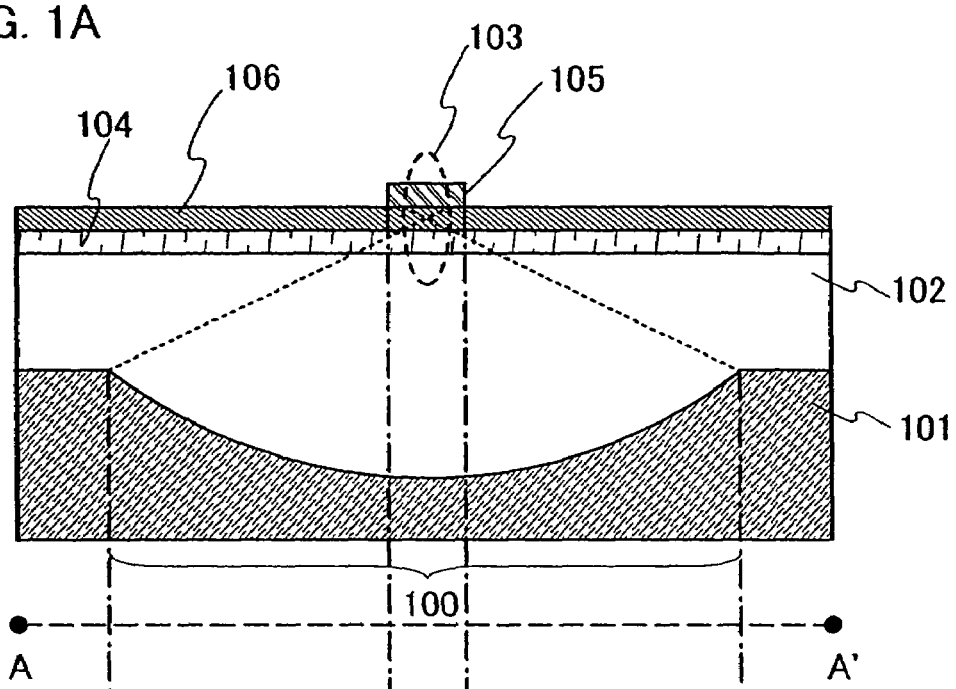
FIGS. 1A and 1B are respectively a cross-sectional view and a top view of a laser oscillator according to one aspect of the present invention.
Figure 1B:
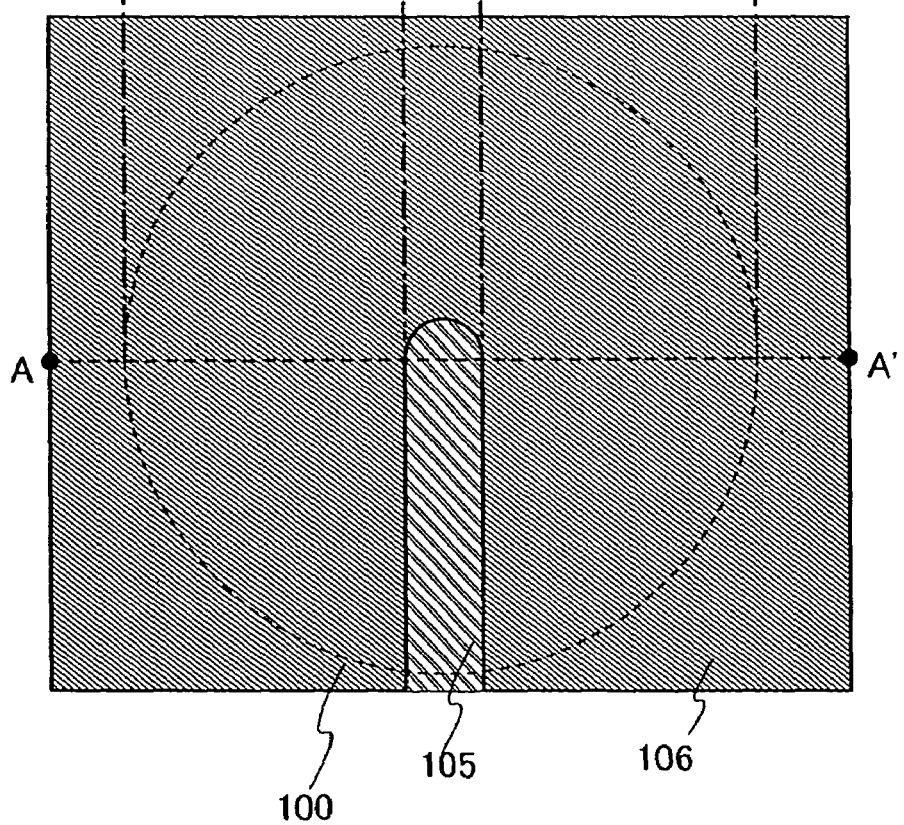

One mode of a laser oscillator according to the present invention is explained with reference to FIGS. 1A and 1B. FIG. 1A is a cross-sectional view of a laser oscillator according to the invention. FIG. 1B is a top view of a laser oscillator according to the invention shown in FIG. 1A. FIG. 1A is a cross-sectional view of FIG. 1A taken along line A-A'. As shown in FIGS. 1A and 1B, a laser oscillator according to the invention comprises a first layer 101 having a concave portion 100, and a second layer 102 formed over the first layer 101 to cover the concave portion 100. The second layer 102 is formed to have a thickness capable of filling in the concave portion 100. The refractive index of the first layer 101 is lower than that of the second layer 102. The second layer 102 has light-transmitting properties.

FIG. 1A shows an example that each of the first layer 101 and the second layer 102 is formed by one layer. Alternatively, each of these layers may be formed by a plurality of layers. In this instance, a layer among the first layer 101 that is closest to the second layer 102 is formed to have lower refractive index than that of a layer among the second layer 102 that is closest to the first layer 101.

As shown in FIGS. 1A and 1B, a light-emitting element 103 is formed over the second layer 102 to be overlapped with the concave portion 100. The light-emitting element 103 comprises two electrodes 104, 105, and an electroluminescent layer 106 interposed between these electrodes 104, 105. Either the electrode 104 or 105 is an anode, and another is a cathode. FIGS. 1A and 1B show that the electrode 104 serves as an anode, and the electrode 105 serves as a cathode. Alternatively, the electrode 104 may serve as a cathode, and the electrode 105 may serve as an anode. The electroluminescent layer 106 can emit light when current is supplied thereto by applying a forward voltage to these electrodes 104, 105.

In the laser oscillator shown in FIGS. 1A and 1B, the electrode 105 included in the light-emitting element 103 and the first layer 101 serve as reflectors, and an optical resonator is formed by these reflectors. Further, the first layer 101 has a curved surface at the concave portion 100, and the center of curvature is located at the light-emitting element 103 side, that is, a distance of the first layer 101 to the center of curvature is longer than that of the first layer to the light emitting element 103. The electrode 105 serving as a reflector has a plane surface. Accordingly, the laser oscillator shown in FIGS. 1A and 1B has a half-spherical resonator. Light generated in the electroluminescent layer 106 between the electrode 105 and the first layer 101 is resonated by the electrode 105 and the first layer 101 to be produced as laser oscillation. Consequently, laser light is emitted from the electrode 105. In the optical resonator, an optical axis of oscillating light intersects with the electrode 105.

Figure 2:
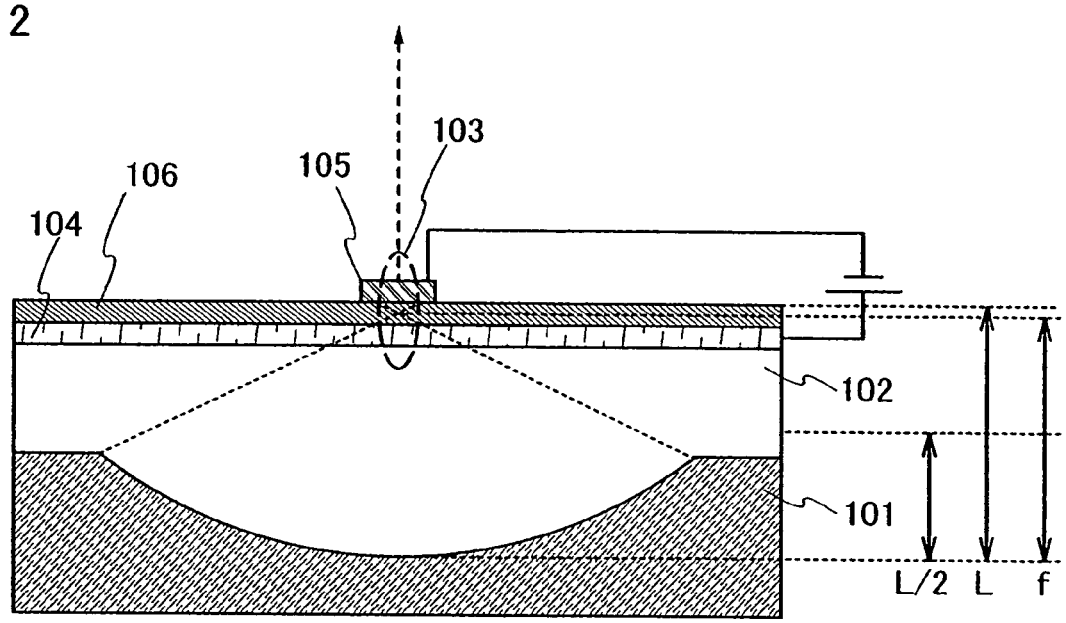
FIG. 2 is a cross-sectional view of a laser oscillator according to one aspect of the invention.

FIG. 2 shows the laser oscillator shown in FIGS. 1A and 1B in which a forward voltage is applied to the electrodes 104, 105. By applying voltage to the electrodes 104, 105, light generated in the electroluminescent layer 106 is resonated. The optical resonator is a stable resonator in which the distance L that corresponds to the length of the resonator between the electrode 105 and the first layer 101, and the focal distance f satisfy f≧L/2. Accordingly, the oscillation efficiency of laser light emitted from the electrode 105 can be improved.

As used herein, the term "the length of the resonator" refers to a farthermost distance between the two reflectors in a parallel direction of an optical path of oscillating laser light.

FIGS. 1A and 1B illustrate that the electrode of a light-emitting element is used as a reflector having a plane surface. However, the present invention is not limited thereto. Besides the electrode, a film having a plane surface may be used as a reflector.

FIGS. 1A, 1B, and 2 illustrate that light is resonated between either the electrode of the light-emitting element and the reflector having the concave portion formed separately. However, the invention is not limited thereto. A concave portion may be provided to the electrode of the light-emitting element to resonate light between the electrode and another electrodes. One mode of a laser oscillator according to the invention in which light can be resonated between two electrodes of a light-emitting element is explained with reference to FIG. 3.

Figure 3:
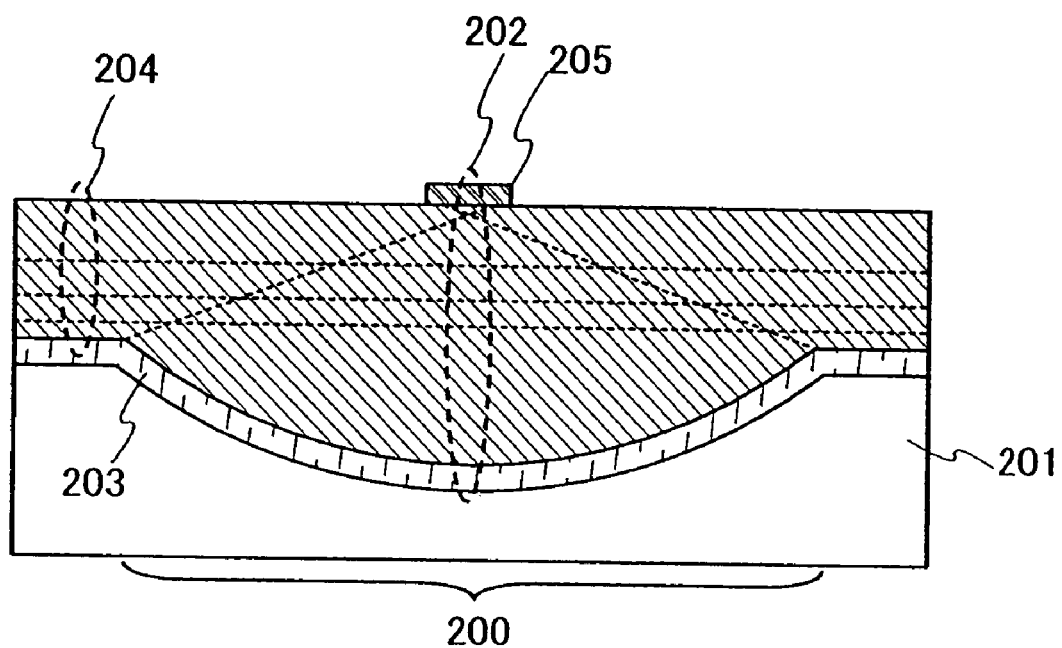
FIG. 3 is a cross-sectional view of a laser oscillator according to one aspect of the invention.

FIG. 3 is a cross-sectional view of a laser oscillator according to the invention. As shown in FIG. 3, the laser oscillator according to the invention comprises a first layer 201 having a concave portion 200, and a light-emitting element 202 formed over the first layer 201 to be overlapped with the concave portion 200. Further, the light-emitting element 202 comprises an electrode 203 formed over the concave portion of the first layer 201, an electroluminescent layer 204 formed over the electrode 203, and an electrode 205 formed over the electroluminescent layer 204 to be overlapped with the electrode 203. The electrode 203 has a curved surface at the concave portion 200 of the first layer 201. The center of the curvature is located at the electrode 205 side, that is, a distance of the electrode 203 to the center of curvature is longer than that of the electrode 203 to the electrode 205.

FIG. 3 shows that the first layer 201 is formed by one layer. Alternatively, the first layer 201 may be formed by a plurality of layers.

As shown in FIG. 3, a surface of the electroluminescent layer 204 at the side of the electrode 205 is planarized, and the electrode 205 formed over the planarized electroluminescent layer 204 has a plane surface. Accordingly, either the electrode 203 or 205, each of which serves as a reflector, has a curved surface, and another has a plane surface. Therefore, the laser oscillator shown in FIG. 3 has a half-spherical resonator as in the case with FIGS. 1A and 1B. The optical resonator of the laser oscillator shown in FIG. 3 is a stable resonator in which the distance L that corresponds to the length of the resonator between the electrodes 203 and 205, and the focal distance f satisfy f≧L/2. According to the foregoing structure, the oscillation efficiency of laser light emitted from the electrode 205 can be improved.

Either the electrode 203 or 205 is an anode, and another is a cathode. FIG. 3 shows that the electrode 203 serves as an anode, and electrode 205 serves as a cathode. Alternatively, the electrode 203 may serve as a cathode, and electrode 205 may serve as an anode. Light can be generated in the electroluminescent layer 204 when current is supplied to the electroluminescent layer 204 by applying a forward voltage to the electrodes 203, 205.

FIG. 3 shows that the electroluminescent layer 204 is formed by a plurality of layers including a light-emitting layer. Alternatively, the electroluminescent layer 204 may include only a light-emitting layer. Any layer of the electroluminescent layer 204 comprises a high molecular electroluminescent material capable of forming a film by spin coating, subsequently, the electroluminescent layer 204 can be easily planarized. In the case that the electroluminescent layer 204 is formed by a plurality of layers, the surface of a layer provided between the electrode 203 and the light-emitting layer is planarized. For example, in the case that an anode is formed over the first layer 201 having a concave portion, a hole injecting layer or a hole transporting layer may be formed by a high molecular electroluminescent material such as PEDOT to have a planarized surface. Further, in the case that a cathode is formed over the first layer having a concave portion, an electron injecting layer or an electron transporting layer is formed to have a planarized surface.

Then, light generated in the electroluminescent layer 204 is resonated by the electrodes 203, 205 serving as reflectors, and so laser light is emitted from the electrode 205. The optical axis of the laser light intersects with the electrode 205.

FIG. 3 shows that a curved surface is provided to the electrode 203 by forming the electrode 203 over the first layer 201 having the concave portion 200. However, the present invention is not limited thereto. A concave portion with a curved surface may be directly provided to the electrode 203 instead of forming the electrode 203 over a layer having a concave portion.

FIG. 3 shows that the electrode of the light-emitting element is used as a reflector having a plane surface. However, the invention is not limited thereto. Besides the electrode, a film having a plane surface may be used as a reflector.

The resonator of a laser oscillator according to the invention is not limited to a half-spherical resonator. The resonator may be confocal, concentric, or half-spherical in which two reflectors have curved surfaces. One mode of a laser oscillator according to the invention that has a confocal resonator is explained with reference to FIG. 4.

Figure 4:
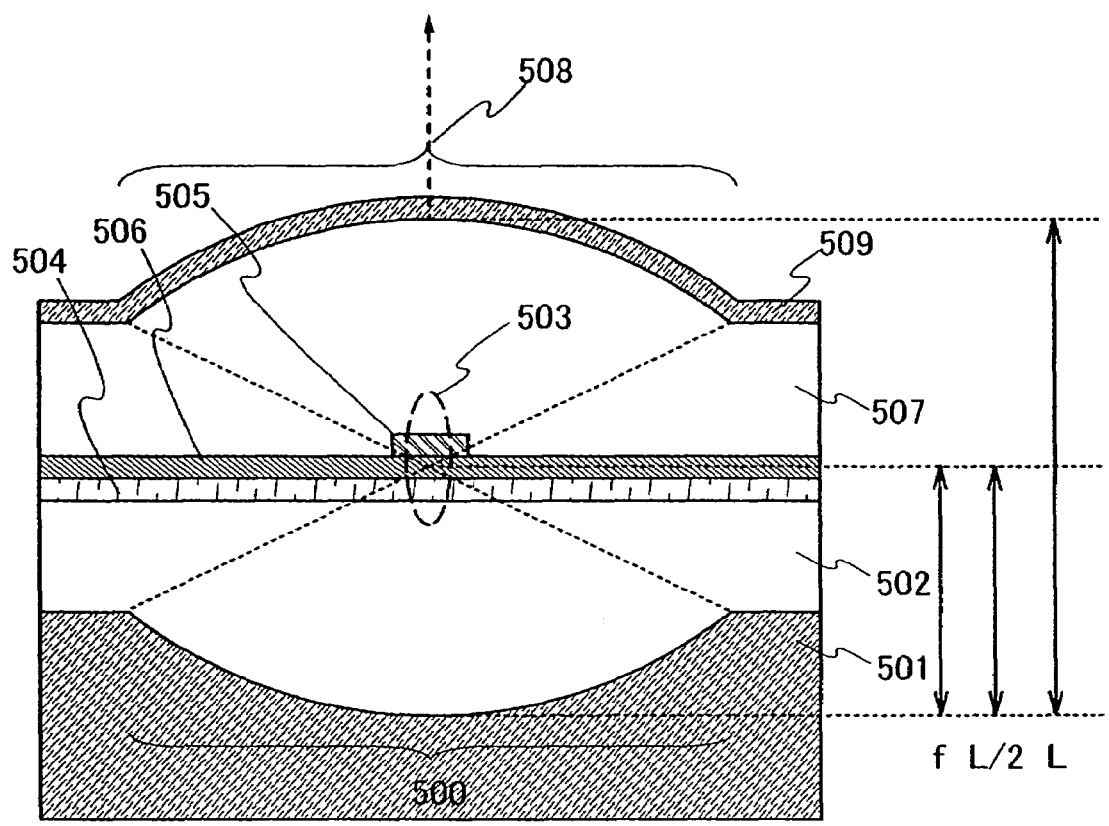
FIG. 4 is a cross-sectional view of a laser oscillator according to one aspect of the invention.

FIG. 4 is a cross-sectional view of a laser oscillator according to the invention. As shown in FIG. 4, a laser oscillator according to the invention comprises a first layer 501 having a concave portion 500, and a second layer 502 formed over the first layer 501 to cover the concave portion 500. The second layer 502 is formed to have a thickness capable of filling in the concave portion 500. The refractive index of the first layer 501 is lower than that of the second layer 502. The second layer 502 has light-transmitting properties.

FIG. 4 shows an example that each of the first layer 501 and the second layer 502 is formed by one layer. Alternatively, each of these layers may be formed by a plurality of layers. In this instance, a layer among the first layer 501 that is closest to the second layer 502 is formed to have lower refractive index than that of a layer among the second layer 502 that is closest to the first layer 501.

As shown in FIG. 4, a light-emitting element 503 is formed over the second layer 502 to be overlapped with the concave portion 500. The light-emitting element 503 comprises two electrodes 504, 505, and an electroluminescent layer 506 interposed between these electrodes 504, 505. Either the electrode 504 or 505 is an anode, and another is a cathode. FIG. 4 shows that the electrode 504 serves as an anode, and the electrode 505 serves as a cathode. Alternatively, the electrode 504 may serve as a cathode, and the electrode 505 may serve as an anode. The electroluminescent layer 506 can emit light when current is supplied thereto by applying a forward voltage to these electrodes 504, 505.

As shown in FIG. 4, a third layer 507 is formed to cover the light-emitting element 503. The third layer 507 has light-transmitting properties and has a convex portion 508 to be overlapped with the light-emitting element 503. Further, a reflective film 509 serving as a reflector is formed over the third layer 507 to cover the convex portion 508. The reflective film 509 is formed by a material that has lower refractive index than that of the third layer 507.

FIG. 4 shows an example that each of the third layer 507 and the reflective film 509 is formed by one layer. Alternatively, each of these layers may be formed by a plurality of layers. In this instance, a layer among the third layer 507 that is closest to the reflective film 509 is formed to have higher refractive index than that of a layer among the reflective film 509 that is closest to the third layer 507.

In the laser oscillator shown in FIG. 4, the first layer 501 and the reflective film 509 serve as reflectors, and an optical resonator is formed by these reflectors. Further, the first layer 501 has a curved surface at the concave portion 500, and the center of curvature is located at the light-emitting element 503 side, that is, a distance of the first layer 501 to the center of curvature is longer than that of the first layer 501 to the light-emitting element 503. The reflective film 509 has a curved surface that is overlapped with the convex portion 508 of the third layer 507. The center of curvature of the curved surface is located at the light-emitting element 503 side, that is, a distance of the third layer 507 to the center of curvature is longer than that of the third layer 507 to the light-emitting element 503. Further, a laser oscillator shown in FIG. 4 has a confocal resonator. Then, let the distance that corresponds to the length of the resonator between the first layer 501 and the reflective film 509 be L, let the radius of curvature of the first layer 501 be r1, and let the radius of curvature of the reflective film 509 be r2, $L=(r1+r2)/2$ is satisfied.

The diffraction loss can be minimized when the radiuses of curvature of the two reflectors r1, r2 and the length of the resonator L are completely equal to each other. When the radiuses of curvature r1 and r2 are different from each other, and the length of the resonator L has the value intermediate between the radiuses of curvature r1 and r2, the diffraction loss becomes extremely large. Accordingly, a near-confocal resonator in which two reflectors are arranged so as to be diverged from the position of a confocal point only a distance larger than an error range of the radius of curvature estimated during a process for manufacturing a concave portion may be provided.

A resonator of a laser oscillator according to the invention is not limited to a confocal resonator. The resonator may be a concentric resonator or a spherical resonator. In the case that a concentric resonator is formed, the resonator is formed to satisfy $L=r1+r2$. In the case that spherical resonator is formed, the resonator is formed to satisfy $r1=r2=L/2$.

Light generated in the electroluminescent layer 506 between the first layer 501 and the reflective film 509 is resonated by the first layer 501 and the reflective film 509 to be emitted from the reflective film as laser light. In the optical resonator, an optical axis of the oscillating laser light intersects with the reflective film 509.

The optical resonator shown in FIG. 4 is a stable resonator. Accordingly, the length of resonator L, the radius of curvature r1, and the radius of curvature r2 satisfy the following formula:

$$0 \leq \{1-(L/r1)\} \times \{1-(L/r2)\} \leq 1$$

In addition, a focal distance f corresponds to half of the radius of curvature r. According to the foregoing structure, oscillation efficiency of laser light emitted from the electrode 505 can be improved.

A half-spherical optical resonator including a light-emitting element of a laser oscillator according to the invention may be provided with a convex portion serving as an optical system for refracting and converting laser light over the light-emitting element. One mode of a laser oscillator according to the invention having a convex portion serving as an optical system is explained with reference to FIGS. 5A and 5B.

Figure 5A:
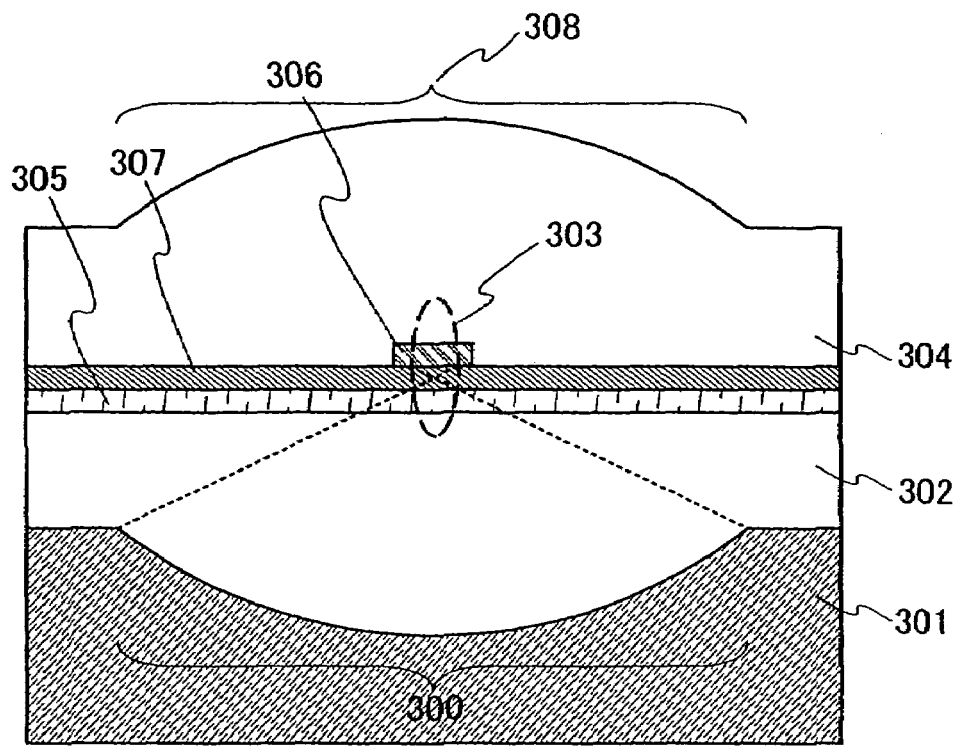
FIGS. 5A and 5B are cross-sectional views of a laser oscillator according to one aspect of the invention.

FIG. 5A is a cross-sectional view of a laser oscillator according to the invention. As shown in FIG. 5A, a laser oscillator according to the invention comprises a first layer 301 having a concave portion 300, and a second layer 302 formed over the first layer 301 to cover the concave portion 300. The second layer 302 is formed to have a thickness capable of filling in the concave portion 300. The refractive index of the first layer 301 is lower than that of the second layer 302. The second layer 302 has light-transmitting properties.

FIG. 5A shows that each the first layer 301 and the second layer 302 is formed by one layer. Alternatively, each the first layer 301 and the second layer 302 may be formed by a plurality of layers. In this instance, a layer among the first layer 301 that is closest to the second layer 302 is formed to have lower refractive index than that of a layer among the second layer 302 that is closest to the first layer 301.

As shown in FIG. 5A, a light-emitting element 303 is formed over the planarized second layer 302 to be overlapped with the concave portion 300. Further, a third layer 304 is formed to cover the light-emitting element 303. The light-emitting element 303 comprises two electrodes 305, 306, and an electroluminescent layer 307 interposed between these electrodes 305, 306. Either the electrode 305 or 306 is an anode, and another is a cathode. FIG. 5A shows that the electrode 305 serves as an anode, and the electrode 306 serves as a cathode. Alternatively, the electrode 305 may serve as a cathode, and the electrode 306 may serve as an anode. The electroluminescent layer 307 can emit light when current is supplied thereto by applying a forward voltage to these electrodes 305, 306.

The third layer 304 has light-transmitting properties and is provided with a concave portion 308 to be overlapped with the light-emitting element 303.

The first layer 301 has a curved surface at the concave portion 300. The center of curvature of the curved surface is located at the light-emitting element 303 side, that is, a distance of the first layer 301 to the center of curvature is longer than that of the first layer 301 to the light-emitting element 303. The third layer 304 has a curved surface at the convex portion 308. The center of curvature of the curved surface is located at the light-emitting element 303 side, that is, a distance of the third layer 304 to the center of curvature is longer than that of the third layer 304 to the light-emitting element 303.

FIG. 5A shows that the third layer 304 is formed by one layer. Alternatively, the third layer 304 may be formed by a plurality of layers.

In the laser oscillator shown in FIG. 5A, the electrode 306 of the light-emitting element 303 and the first layer 301 serve as a reflector, and an optical resonator is formed by the two reflectors. Further, the first layer 301 has a curved surface at the concave portion 300. The center of curvature of the curved surface is located at the side of the light-emitting element 303 above the first layer 301. Since the electrode 306 serving as a reflector has a plane surface, the laser oscillator shown in FIG. 5A includes a half-spherical resonator. Light generated in the electroluminescent layer 307 between the electrode 306 and the first layer 301 is resonated by the electrode 306 and the first layer 301 to be emitted from the electrode 306 as laser light. In the optical resonator, an axis of oscillating laser light interests with the electrode 306.

Figure 5B:
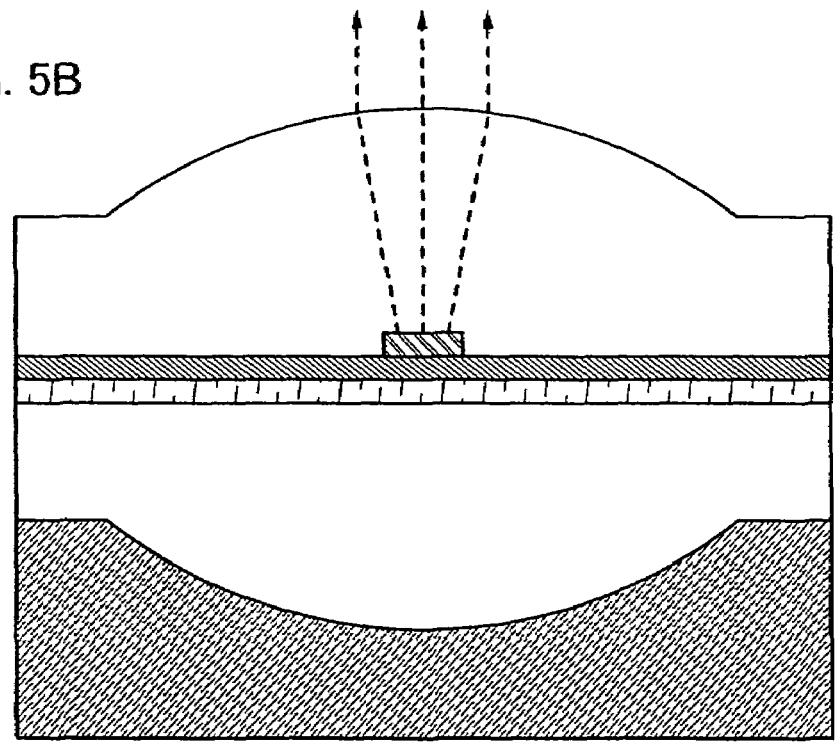

FIG. 5B shows that a forward voltage is applied to the electrodes 305, 306 in the laser oscillator shown in FIG. 5A. By applying voltage to the electrodes 305, 306, light generated in the electroluminescent layer 307 is resonated. The optical resonator is a stable resonator. The distance L between the electrode 305 and the first layer 301 corresponding to the length of the resonator and the focal distance f satisfies $f \geq L/2$. According to the foregoing structure, oscillation efficiency of the emitted laser light from the electrode 305 can be improved.

Further, the oscillating laser light is scattered in a certain degree. The laser light is refracted and converted by the convex portion, and so the divergence angle is controlled. Accordingly, the directivity of the laser light can be improved. In addition, in order to control the divergence angle, the focal distance of the convex portion 308 may be optically designed depending on the divergence angle of laser light emitted to the convex portion 308. Contrary to a laser oscillator in which an optical system is separately provided, the resistance against physical shocks of the laser oscillator shown in FIG. 5 can be improved since a part of the layer serves as an optical system.

Figure 12:
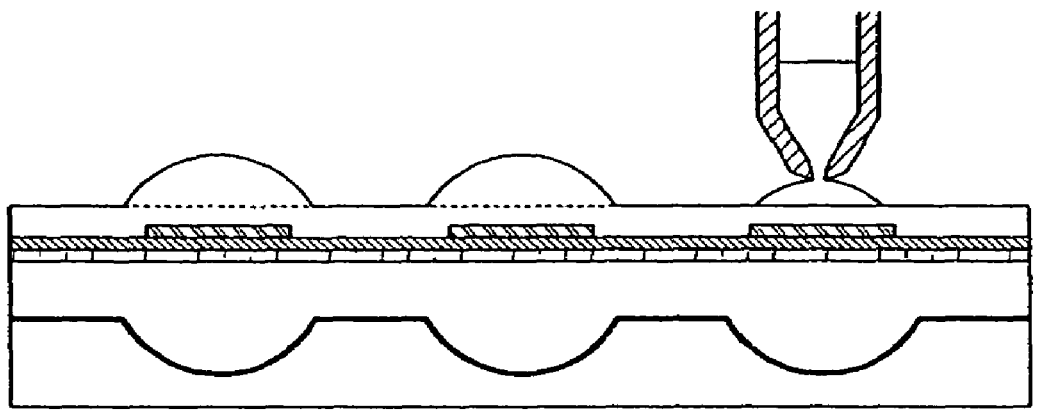
FIG. 12 is a view for showing an embodiment for a method for manufacturing a convex portion.

The convex portion 308 may be formed after forming the third layer 304 by a method of discharging liquid drops as shown in FIG. 12.

FIG. 5 shows that light is resonated between either the electrodes of the light-emitting element and the reflector having the concave portion separately provided. However, the invention is not limited thereto. A concave portion may be provided to an electrode of a light-emitting element to resonate light between two electrodes as shown in FIG. 3.

FIG. 5 shows that an electrode of a light-emitting element is used as a reflector having a plane surface, however, the present invention is not limited thereto. Besides the electrode, a film having a plane surface may be used as a reflector.

In the laser oscillator shown in FIGS. 1 to 5, light is resonated by two electrodes of a light-emitting element or a reflector provided separately. However, the invention is not limited thereto. Layers included in an electroluminescent layer except a light-emitting layer, for example, a hole injecting layer, a hole transporting layer, an electron injecting layer, an electron transporting layer, and the like may be formed to have curved surfaces to reflect light generated in a light-emitting layer as an optical resonator.

EXAMPLE 1

A structure of a light-emitting device used for a laser oscillator according to the present invention is explained in Example 1.

Figure 6:
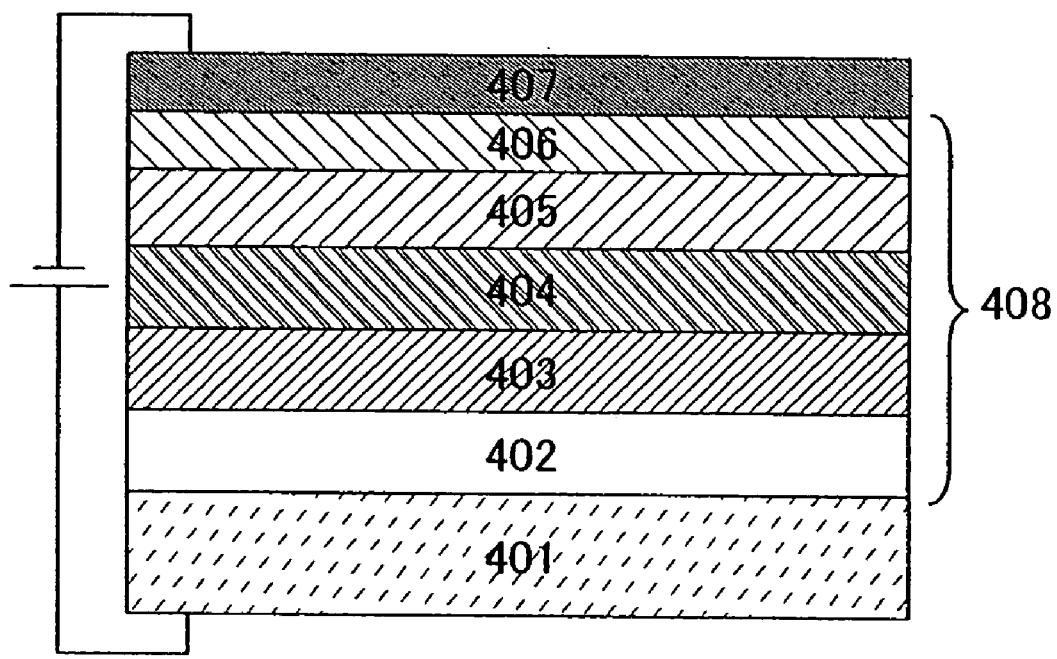
FIG. 6 is a view for showing a structure of a light-emitting element included in a laser oscillator according to one aspect of the invention.

FIG. 6 shows one mode of a device configuration of a light-emitting element used in the present invention. A light-emitting element shown in FIG. 6 includes an electroluminescent layer 408 between an anode 401 and a cathode 407. The electroluminescent layer 408 is formed by stacking over the anode a hole injecting layer 402, a hole transporting layer 403, a light-emitting layer 404, an electron transporting layer 405, and an electron injecting layer 406, sequentially.

A light-emitting element used for a laser oscillator according to the present invention may include at least a light-emitting layer within an electroluminescent layer. Layers having properties other than light emission (a hole injecting layer, a hole transporting layer, an electron transporting layer, and an electron injecting layer) may be used appropriately. Although not limited to the materials recited herein, each the above-mentioned layer is formed by the following materials.

As the anode 401, a conductive material having a large work function is preferably used. In case that light is passed through the anode 401, a material having high light-transmitting properties is used for the anode 401. In this instance, a transparent conductive material such as indium tin oxides (ITO), indium zinc oxides (IZO), or indium tin oxides containing silicon (ITSO) may be used. For example, a single layer formed by one or a plurality of elements among TiN, ZrN, Ti, W, Ni, Pt, Cr, Ag, or the like; a lamination layer of titanium nitride and a film containing aluminum as its main component; a three lamination layer of a titanium nitride film, a film containing aluminum as its main component, and a titanium nitride film; or the like can be used. Alternatively, a lamination layer formed by stacking a material that can reflect light and the foregoing transparent conductive material may be used as the anode 401.

As a hole injection material for the hole injecting layer 402, a material that has comparative small ionization potential and small visible light absorption properties is preferably used. Such material can be broadly divided into metal oxides, low molecular organic compounds, and high molecular organic compounds. Metal oxides such as vanadium oxides, molybdenum oxides, ruthenium oxides, aluminum oxides, or the like can be used. Low molecular organic compounds such as star-burst amine as typified by m-MTDATA; metallophthalocyanine as typified by copper phthalocyanine (abbreviated Cu-Pc); phthalocyanine (abbreviated $H_2$-PC); 2,3-dioxyethylenethiopehen derivatives; or the like can be used. The hole injecting layer 402 may be formed by co-evaporation of the low molecular organic compounds and the metal oxides. High molecular organic compounds such as polyaniline (abbreviated PAni); polyvinyl carbazole (abbreviated PVK); polythiophene derivatives; or the like can be used. Polyethylenedioxythiophene (abbreviated PEDOT), which is one of polythiophene derivatives, doped with polystyrene sulfonate (abbreviated PSS) can be used.

As hole transportation material for the hole transporting layer 403, a known material that has excellent hole transportation properties and low crystallinity can be used. Aromatic amine (that is, the one having a benzene ring-nitrogen bond) based compounds are preferably used. For example, 4,4-bis[N-(3-methylphenyl)-N-phenylamino]-biphenyl (abbreviated TPD), and derivatives thereof such as 4,4'-bis[N-(1-naphthyl)-N-phenyl-amino]-biphenyl (abbreviated a-NPB) are widely used. Also used are star burst aromatic amine compounds such as 4,4',4''-tris(N,N-diphenylamino)-triphenyl amine (abbreviated TDATA), and MTDATA. Alternatively, 4,4',4''-tris(N-carbazolyl)triphenylamine (abbreviated TCTA) may be used. As a high molecular material, poly (vinylcarbazole) is having excellent hole transportation properties can be used. Further, inorganic substances such as $MoO_3$ can be used.

A known material can be used for the light-emitting layer 404. For example, metal complexes such as tris(8-quinolinolate) aluminum (abbreviated $Alq_3$), tris(4-methyl-8-quinolinolate) aluminum (abbreviated $Almq_3$), bis(10-hydroxybenzo[η]-quinolinato) beryllium (abbreviated $BeBq_2$), bis(2-methyl-8-quinolinolato)-(4-hydroxy-biphenylyl)-aluminum (abbreviated BAlq), bis[2-(2-hydroxyphenyl)-benzooxazolate]zinc (abbreviated $Zn(BOX)_2$), or bis[2-(2-hydroxyphenyl)-benzothiazolate]zinc (abbreviated $Zn(BTZ)_2$) can be used. Various fluorescent dyes (coumarin derivatives, quinacridone derivatives, rubrene, 4,4-dicyanoethylene, 1-pyron derivatives, stilbene derivatives, various condensed aromatics, or the like) can be used. Phosphorescent materials such as platinum octaethylporphyrin complexes, tris(phenylpyridine)iridium complexes, or tris(benzylideneacetonato) phenanthrene europium complexes can be used. Especially, phosphorescent materials have longer excitation lifetime than that of fluorescent materials, and so the phosphorescent materials can make easily population inversion that is indispensable to laser oscillation, that is, the state where the number of molecules at a ground state is larger than that at an excited state. The foregoing material can be used as dopant or a single layer film.

As a host material for the light-emitting layer 404, a hole transportation material or an electron transportation material as typified by the foregoing examples can be used. A bipolar material such as 4,4'-N,N'-dicarbazolylbiphenylyl (abbreviated CBP) can be used.

As an electron transportation material for the electron transporting layer 405, metal complexes as typified by $Alq_3$ having a quinoline skeleton or a benzoquinoline skeleton, or the mixed ligand complexes can be used. Specifically, metal complexes such as $Alq_3$, $Almq_3$, $BeBq_2$, BAlq, $Zn(BOX)_2$, or $Zn(BTZ)_2$ can be nominated. Alternatively, oxadiazole derivatives such as 2-(4-biphenyl)-5-(4-tert-butylphenyl)-1, 3,4-oxadiazole (abbreviated PBD), or 1,3-bis[5-(p-tert-butylphenyl)-1,3,4-oxadiazole-2-yl]benzene (abbreviated OXD-7); or triazole derivatives such as 3-(4-tert-butylphenyl)-4-phenyl-5-(4-biphenylyl)-1,2,4-triazole (abbreviated TAZ), or 3-(4-tert-butylphenyl)-4-(4-ethylphenyl)-5-(4-biphenylyl)-1,2,4-triazole (abbreviated p-EtTAZ); imidazole derivatives such as TPBI; bathophenanthroline (abbreviated BPhen); bathocuproin (abbreviated BCP); or the like can be used.

As an electron injecting material for the electron injecting layer, the foregoing electron transportation material can be used. Alternatively, alkali metal halides such as LiF or CsF, alkali earth metal halides such as $CaF_2$, or an ultra thin film of insulator, for example, alkali metal oxides such as $LiO_2$ is frequently used. Alternatively, alkali metal complexes such as lithium acetylacetonate (abbreviated Li(acac)) or 8-quinolinolato-lithium (abbreviated Liq) can be effectively used.

For the cathode 407, metals having a small work function, alloys, electric conductive compounds, or a mixture of the above can be used. Specifically, alkali metals such as Li or Cs; alkali earth metals such as Mg, Ca, Sr; alloys including the above elements (Mg:Ag, Al:Li, or the like); or rare earth metals such as Yb or Er can be used. In case of using an electron injecting layer such as LiF, CsF, $CaF_2$, $Li_2O$, or the like, a general conductive thin film such as aluminum can be used. In case that light is passed through the cathode 407, the cathode 407 may be formed by a lamination layer of an ultra thin film containing alkali metals such as Li or Cs and alkali earth metals such as Mg, Ca, Sr; and a transparent conductive film (ITO, IZO, ZnO, or the like). Alternatively, the cathode 407 may be formed by a lamination layer of an electron injecting layer formed by co-evaporation of alkali metals or alkali earth metals, and electron transporting materials; and a transparent conductive film (ITO, IZO, ZnO, or the like).

An optical resonator is formed by two reflectors, either of which is formed to have reflectivity as high as possible and the other of which is formed to have a certain level of light-transmitting properties. Accordingly, laser light can be emitted from the reflector that has high light-transmitting properties. For example, in case that the anode 401 and the cathode 407 are used as reflectors to emit laser light, these electrodes are formed by selecting materials to have thicknesses capable of having transmittance of approximately from 5 to 70%. Alternatively, in case that a reflector is formed separately, the reflector is formed by materials so that light is passed through the anode 401 or the cathode 407.

The interval of the reflector (the length of the resonator) is an integral multiple of a half-wavelength $\lambda$ for resonating. A lamination configuration of a light-emitting element is designed, so that light reflected by a reflector and a phase of light newly generated are correspondent.

A method for laminating each layer of the above-mentioned light-emitting element according to the invention is not limited. If the light-emitting element can be formed by laminating layers, any method such as vacuum vapor deposition, spin coating, ink jetting, or dip coating can be utilized.

EXAMPLE 2

One mode of a laser oscillator including a plurality of light-emitting elements according to the present invention is explained in Example 2.

Figure 7A:
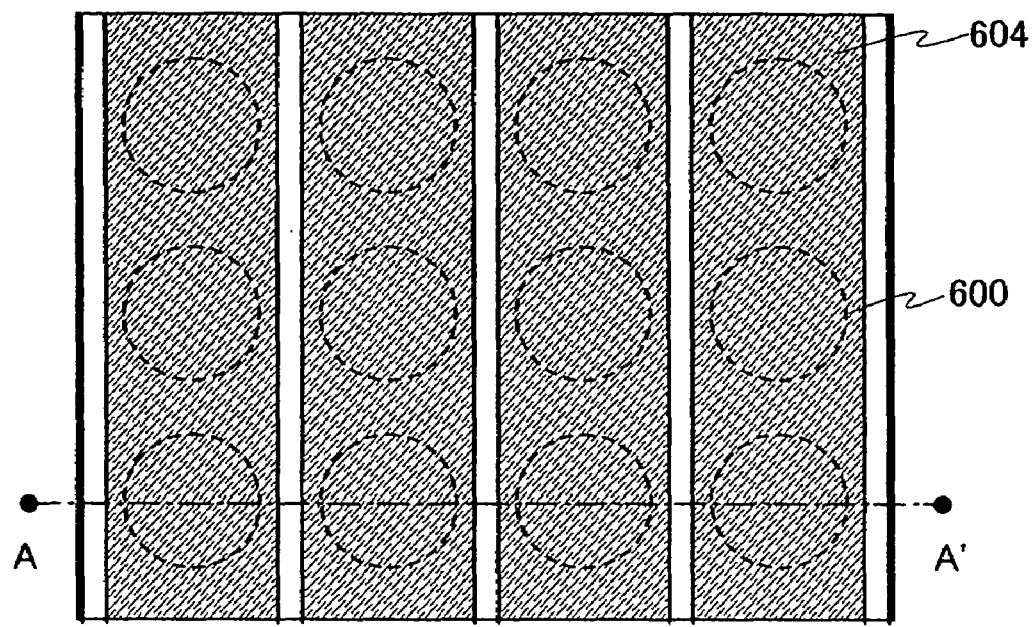
FIGS. 7A and 7B are respectively a top view and a cross-sectional view during a process for manufacturing a laser oscillator according to one aspect of the invention.
Figure 7B:
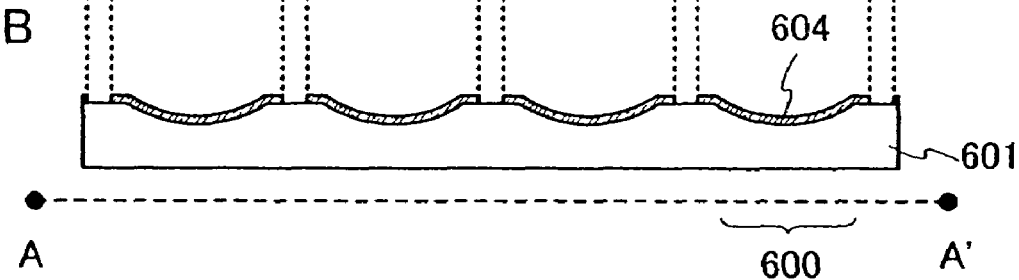

FIG. 7A is a top view of a laser oscillator according to Example 2 when an anode for a light-emitting element is manufactured. FIG. 7B is a cross-sectional view taken along line A-A' of FIG. 7A. In a laser oscillator according to Example 2, an anode 604 is formed to overlap with each a plurality of concaves 600 over a first layer 601 that has the plurality of concaves 600. The anode 604 is formed by a material that is reflects light to be served as a reflector.

In Example 2, the anode 604 is used for a reflector. However, Example 2 is not limited thereto. A reflective film serving as a reflector may be formed over the concave portion, and an anode having light-transmitting properties may be formed over the reflective film.

Figure 8A:
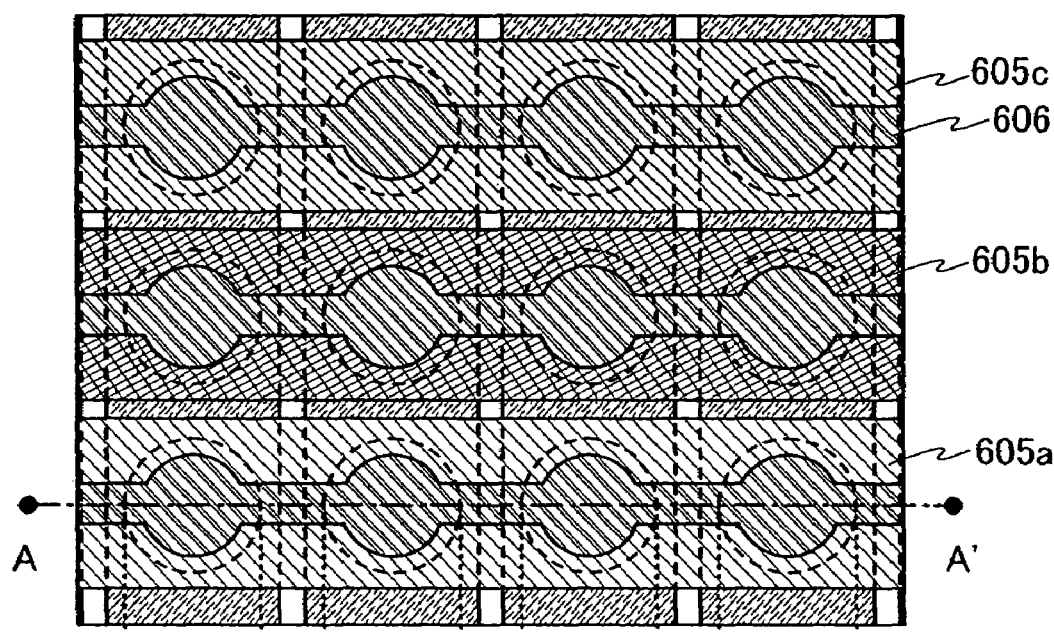
FIGS. 8A and 8B are respectively a top view and a cross-sectional view of a laser oscillator according to one aspect of the invention.
Figure 8B:
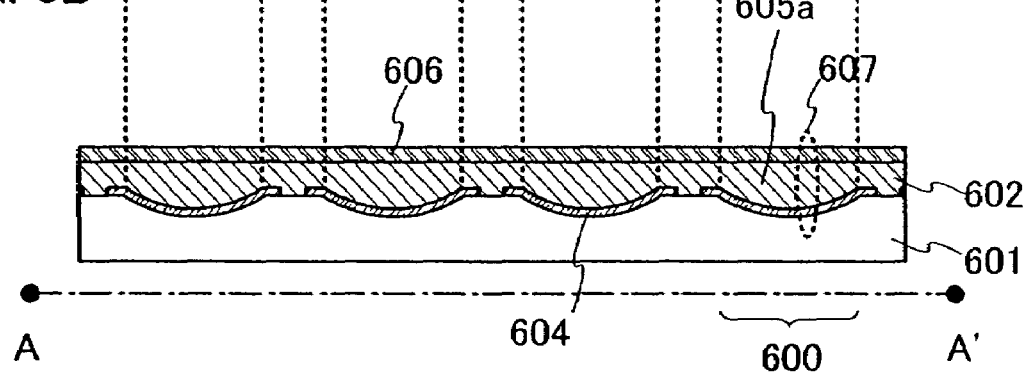

FIG. 8A is a top view of a laser oscillator according to Example 2 when a light-emitting element is manufactured completely. FIG. 8B is a cross-sectional view taken along line A-A' of FIG. 8A. As shown in FIGS. 8A and 8B, electroluminescent layers 605a to 605c corresponding to three color of red (R), green (G), and blue (B) are formed to be overlapped with the plurality of concaves 600 over the anode 604. The electroluminescent layers 605a to 605c are formed separately in FIG. 8A. Alternatively, the electroluminescent layers 605a to 605c may be formed so as to be overlapped partly with each other. Over the electroluminescent layers 605a to 605c, a cathode 606 is formed to be overlapped with the plurality of concaves 600.

According to Example 2, the arbitrary cathode 606 is partly overlapped with all of each anode 604. The overlapping portion serves as a light-emitting element 607. Each the light-emitting element 607 is located on each the concaves 600. The cathode 606 is formed to have transmittance of approximately from 5 to 70% so that light generated in the electroluminescent layers 605a to 605c is resonated between the anode 604 and the cathode 606, each of which serves as a reflector, to be emitted from the cathode 606. As same as a passive matrix light-emitting device, a laser oscillator according to Example 2 can emit laser light from the selected light-emitting element 607 by controlling voltage applied to the anode 604 and the cathode 606.

In Example 2, the concave portion 600 is formed to be closer to the anode 604 than the cathode 606. Alternatively, the concave portion 600 may be formed to be closer to the cathode 606 than the anode 604. In this instance, laser light is emitted from the anode 604.

The resonator of the laser oscillator according to Example 2 is a half-spherical resonator in which either the two reflectors has a curved surface, and another has a plane surface. Alternatively, the resonator may be confocal, concentric, or spherical in which two reflectors have curved surfaces. In case of using a half-spherical resonator, a convex portion that can improve the directivity of laser light by refracting the laser light may be provided so as to be overlapped with a light-emitting element.

Electroluminescent layers, each of which corresponds to R, G, and B, are provided in Example 2. In case of displaying an image in monochromic color, only a single electroluminescent layer is required. In Addition, a laser oscillator according to this example may be used as a display device. Moreover, the laser oscillator according to this example may be used as an active matrix display device by providing with driving elements to each of light-emitting elements. The display device equipped with the laser oscillator includes a projector, LCD (Liquid crystal display), using the laser oscillator as a backlight, and the like. Specifically, in the case of FS-LCD (Field sequential LCD), a light-emitting element shown in this example that has electroluminescent layers corresponding to each of R, G, and B may be used. As an example of the FS-LCD, the entire disclosure of U.S. Patent 2003/0058210 is incorporated herein by reference.

EXAMPLE 3

Figure 9:
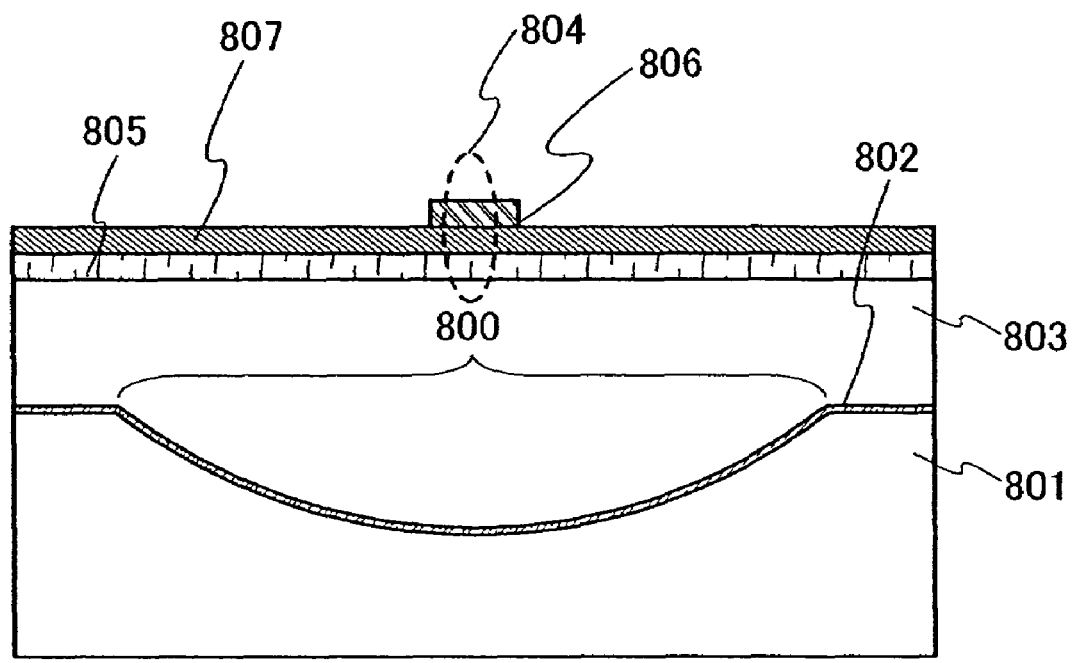
FIG. 9 is a cross-sectional view of a laser oscillator according to one aspect of the invention.

One mode of a laser oscillator shown in FIG. 9 in which a reflective film capable of reflecting light is formed between a first and a second layers is explained in Example 3.

FIG. 9 is a cross-sectional view of a laser oscillator according to Example 3. In the laser oscillator according to Example 3 as shown in FIG. 9, a reflective film 802 is formed over a first layer 801 having a concave portion 800. The reflective film 802 can be formed by a material capable of reflecting light by vapor deposition. As the material for the reflective film 802, a material containing one or a plurality of metal elements such as Al, Ag, Ti, W, Pt, or Cr can be used. A material for the reflective film is not limited to the foregoing materials. Any material can be used as long as it can reflect light. For example, the reflective film may be formed by stacking a plurality of insulating film, each of which has different refractive indexes, such as a silicon oxide film, a silicon nitride film, a titanium oxide film, and the like.

A second layer 803 is formed to cover the reflective film 802. The second layer 803 has light transmitting properties and has a thickness capable of filling in the concave portion 800. Contrary to FIG. 1, the refractive index of the first layer 801 is not always necessary to be lower than that of the second layer 803 since emitted laser light is reflected by the reflective film 802 in a laser oscillator according to Example 3. Further, each the first layer 801 and the second layer 803 is formed by a single layer in FIG. 9, but each the layer may be formed by a plurality of layers.

A light-emitting element 804 is formed over the second layer 803 to overlap with the concave portion 800. The light-emitting element 804 comprises two electrodes 805 and 806, and an electroluminescent layer 807 interposed between the two electrodes 805 and 806. Either the electrode 805 or 806 is an anode, and another is a cathode. FIG. 9 shows that the electrode 805 serves as an anode and the electrode 806 serves as a cathode. Alternatively, the electrode 805 may serve as a cathode and the electrode 806 may serve as an anode. The electroluminescent layer 807 can emit light by applying a forward bias voltage to the electrodes 805 and 806 to supply current to the electroluminescent layer 807.

The first layer 801 has a concave portion 800 with a curved surface. The center of curvature of the curved surface is located at the light-emitting element 804 side, that is, a distance of the reflective film 802 to the center of curvature is longer than that of the reflective film to the light-emitting element 804.

A laser oscillator shown in FIG. 9 is provided with an optical resonator that is formed by a reflective film 802 and an electrode 806 included in the light-emitting element 804. Light emitted from the electroluminescent layer 807 is resonated by the reflective film 802 and the electrode 806 to be emitted as laser light. In the optical resonator, an optical axis of oscillating laser light intersects with the electrode 806.

EXAMPLE 4

Figure 10A:
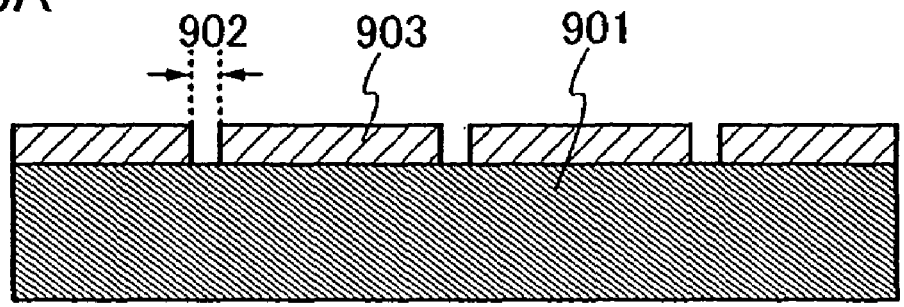
FIGS. 10A to 10C are views for showing an embodiment for a method for manufacturing a concave portion.

A method for manufacturing a concave portion that reflects laser light is explained in Example 4. As shown in FIG. 10A, a first layer 901 that is afterward provided with a concave portion is formed. The first layer 901 may be a glass substrate, a quartz substrate, or a plastic substrate; or a resin film, or an insulating film, each of which is deposited over the foregoing substrate. Then, a mask 903 with an opening portion 902 is formed over the first layer 901.

Figure 10B:
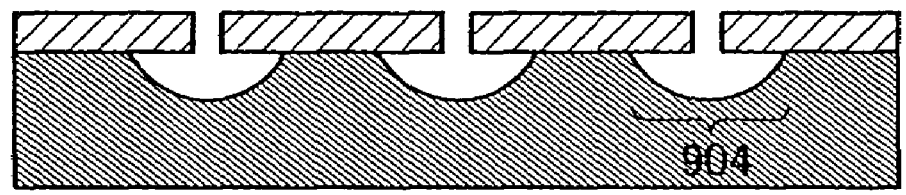

As shown in FIG. 10B, the first layer 901 is wet-etched at the opening portion 902 of the mask 903. The wet-etching is carried out by using etchant that is selected appropriately depending on the material of the first layer 901. For example, hydrofluoric acid is used as the etchant in case that glass is used as the first layer 901. A concave portion 904 with a curved face can be provided to the first layer 901 by anisotropic wet-etching.

Figure 10C:
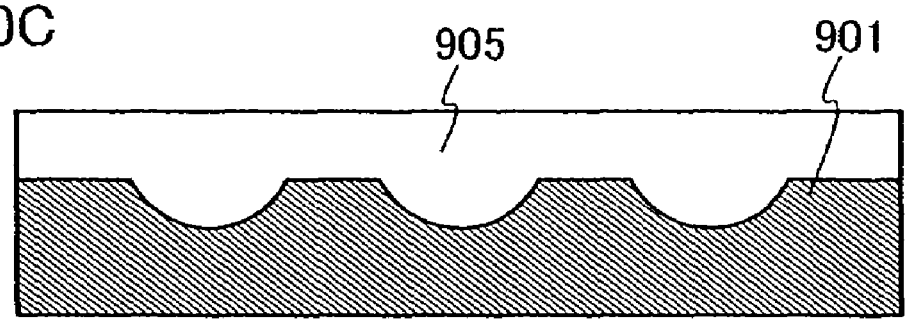

As shown in FIG. 10C, a second layer 905 is formed over the first layer 901 provided with the concave portion 904. The second layer 905 is formed by a material having light-transmitting properties and to have a thickness capable of filling in the concave portion 904. The second layer 905 is formed by a material that has higher refractive index than that of the first layer 901, for example, transition metal oxides, nitrides, or the like can be used in case that the first layer 901 is glass.

Although the second layer 905 is formed on the first layer 901 in Example 4, a reflective film capable of reflecting laser light may be formed between the first layer 901 and the second layer 905. In this instance, the second layer 905 is only have to have transmitting properties, and is not required to be formed by a material that has higher refractive index than that of the first layer 901.

In the present invention, a method for manufacturing the first layer is not limited to that explained in Example 4.

EXAMPLE 5

In Example 5, a method for providing a convex portion to a second layer to provide a concave portion to a first layer is explained.

Figure 11A:
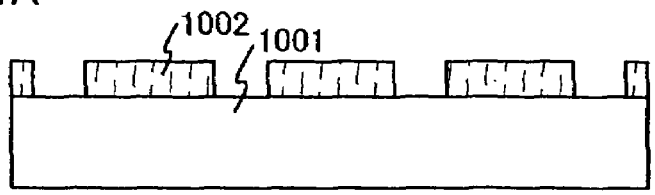
FIGS. 11A to 11F are views for showing an embodiment for a method for manufacturing a concave portion.

As shown in FIG. 11A, resin 1002 is formed that can be melted by heating over a second layer 1001 that is afterward provided with a convex portion. The resin 1002 is patterned into an island-like shape. The second layer 1001 can be a glass substrate, a quartz substrate, a plastic substrate, or the like.

Figure 11B:
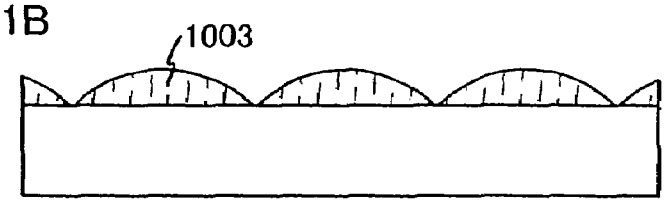

As shown in FIG. 11B, the resin 1002 that is pattered into an island-like shape is melted by heating so that its edge portion has a curved surface. By melting the resin 1002, resin 1003 having a curved surface is formed.

Figure 11C:
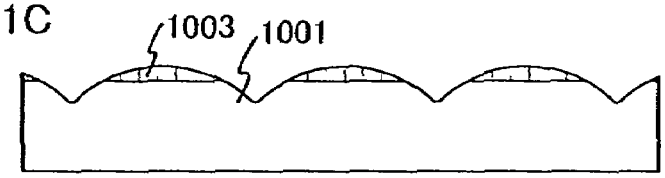
Figure 11D:
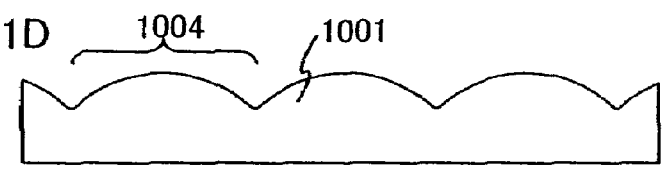

As shown in FIG. 11C, the second layer 1001 is dry-etched by using the resin 1003 as a mask. The dry-etching is carried out by using an etching gas selected appropriately depending on the material of the second layer 1001. For example, a fluorine gas or a chlorine gas such as $CF_4$, $CHF_3$, $Cl_2$, or the like can be used in the case that the second layer 1001 is glass. By the dry-etching, the resin 1003 is etched together as shown in FIG. 11C. Lastly, a convex portion 1004 can be provided to the second layer 1001 depending on the shape of the resin 1003 with a curved surface as shown in FIG. 11D.

Figure 11E:
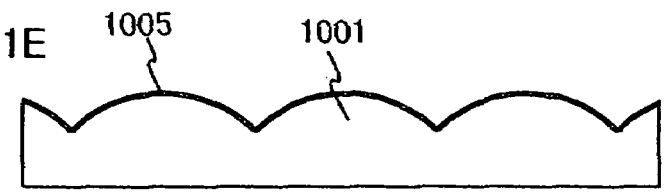
Figure 11F:
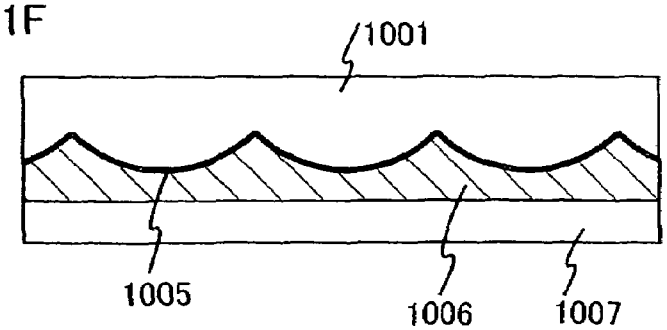

As shown in FIG. 11E, a reflective film 1005 that can reflects laser light is formed over the convex portion 1004 of the second layer 1001. Then, as shown in FIG. 11F, adhesive 1006 that serves as a first layer is coated on the reflective film 1005 to be pasted with a substrate 1007. According to the foregoing structure, a concave portion can be provided to the adhesive 1006 that serves as a first layer.

The reflective film 1005 is formed in order to reflect laser light in Example 5. However, laser light may be reflected by utilizing the difference of the refractive index between the second layer 1001 and the adhesive 1006 that serves as a first layer. In this instance, the refractive index of the adhesive 1006 is made lower than that of the second layer 1001.

EXAMPLE 6

One mode of an electric appliance including a laser oscillation according to the present invention is explained in Example 6.

Figure 13A:
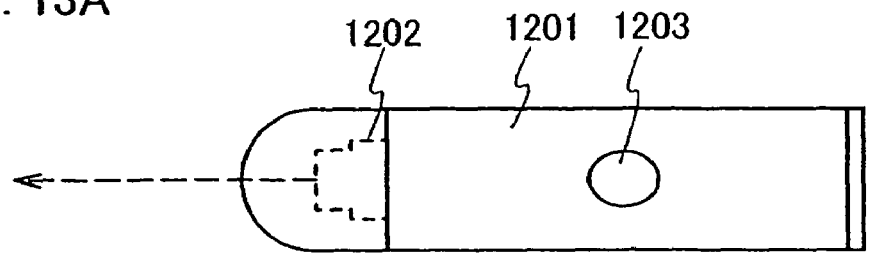
FIGS. 13A to 13C are views for showing a structure of a laser pointer including a laser oscillator according to one aspect of the invention.

FIG. 13A is an external view of a laser pointer including a laser oscillator according to the present invention. Reference numeral 1201 denotes a main body of the laser pointer, and reference numeral 1202 denotes a package provided with the laser oscillator according to the invention. Internal of the main body 1201 is provided with a battery or the like for supplying current to the package 1202 installed with the laser oscillator. Reference numeral 1203 denotes a switch for controlling the application of power.

Figure 13B:
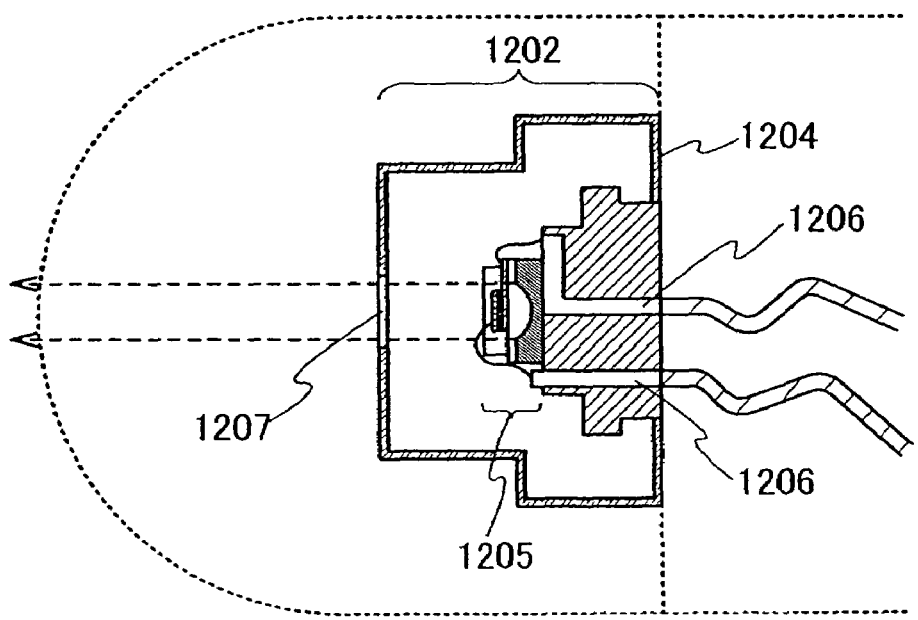

FIG. 13B is an enlarged view of the package 1202. A housing 1204 of the package 1202 is provided with a laser oscillator 1205 according to the invention to shield unnecessary radiation of laser light. A part of the housing 1204 is provided with a window 1207 having light-transmitting properties to emit laser light from the laser oscillator 1205. The laser oscillator 1205 can be supplied with current from the battery installed to the internal of the main body 1201 via a lead 1206.

Figure 13C:
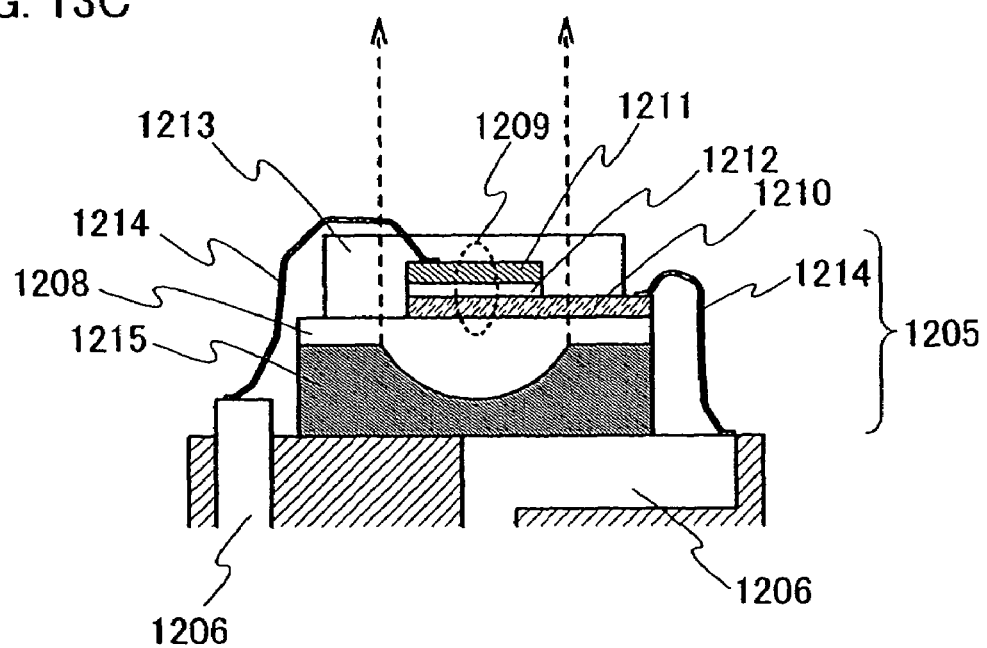

FIG. 13C is an enlarged view of the laser oscillator 1205. The laser oscillator 1205 comprises a first layer 1215 with a concave portion, a second layer 1208 formed over the first layer 1215 so as to fill in the concave portion, and a light-emitting element 1209 formed over the second layer 1208. The light-emitting element 1209 comprises two electrodes 1210, 1211, and an electroluminescent layer 1212 interposed between the two electrodes 1210, 1211. The two electrodes 1210, 1211 are connected to a lead 1206 by a wire 1214. Reference numeral 1213 corresponds to resin for sealing the electroluminescent layer 1212. The resin can prevent the electroluminescent layer 1212 from being deteriorated due to moisture, oxygen, and the like.

Light is generated when current is supplied to the electroluminescent layer 1212 by applying a forward voltage to the electrodes 1210, 1211 via the lead 1206. Then, light generated in the electroluminescent layer 1212 is resonated between the electrode 1211 and the first layer 1215, and then, laser light is emitted from the electrode 1211 as denoted by dotted arrows.

A laser oscillator with the structure illustrated in FIG. 1 is explained in Example 6, however, Example 6 is not limited to the structure recited herein. The laser oscillator may have another structure as illustrated in FIGS. 3, 4, and 5, for example. Alternatively, a laser oscillator including a plurality of light-emitting elements in a passive matrix may be used.

EXAMPLE 7

A structure of a light-emitting element used for a laser oscillator according to the present invention is explained in Example 7.

Figure 14:
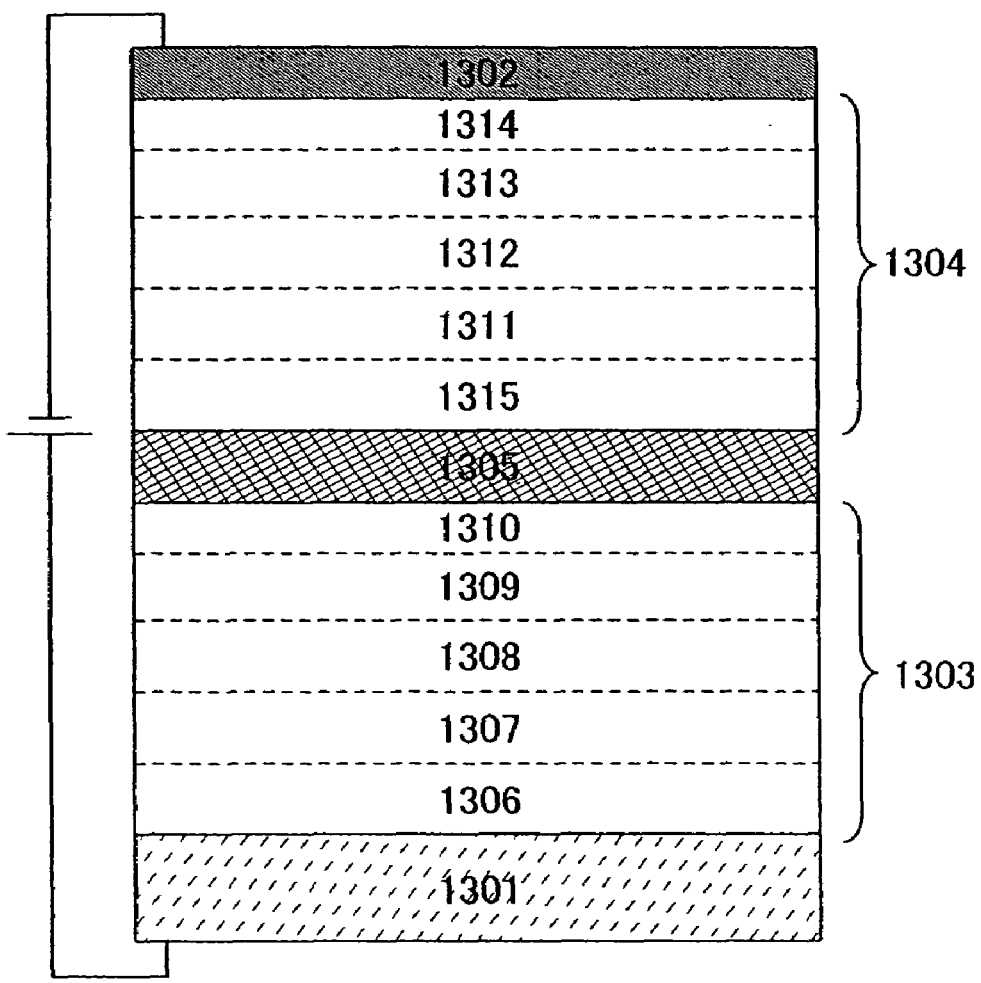
FIG. 14 is a view for showing a structure of a light-emitting element included in a laser oscillator according to one aspect of the invention.

FIG. 14 shows one mode of a device configuration of a light-emitting element according to the invention. A light-emitting element shown in FIG. 14 comprises an anode 1301, a cathode 1302, and the electroluminescent layers 1303, 1304 interposed between the pair of electrodes. Further, the light-emitting element shown in FIG. 14 comprises a charge generation layer 1305 that is a floating electrode not connected to an external circuit between the two electroluminescent layers 1303, 1304. The electroluminescent layer 1303 is formed by sequentially stacking a hole injecting layer 1306, a hole transporting layer 1307, a light-emitting layer 1308, an electron transporting layer 1309, and an electron injecting layer 1310 over the anode 1301. Further, the electroluminescent layer 1304 is formed by sequentially stacking a hole injecting layer 1315, a hole transporting layer 1311, a light-emitting layer 1312, an electron transporting layer 1313, and an electron injecting layer 1314 over the charge generation layer 1305.

The light-emitting element used for a laser oscillator according to the invention may comprise at least a light-emitting layer in each electroluminescent layer. Layers having properties other than light emission (a hole injecting layer, a hole transporting layer, an electron transporting layer, and an electron injecting layer) may be appropriately used with the light-emitting layer. A material that can be used for the foregoing each layer is recited in Example 1. Note that the material that can be used in the invention is not limited to that described in Example 1.

When a forward voltage is applied to the anode 1301 and the cathode 1302 of the light-emitting element shown in FIG. 14, electrons and holes are injected to the electroluminescent layers 1303, 1304, respectively. Then, the recombination of carriers is carried out in each the electroluminescent layers 1303, 1304 to emit light. Accordingly, in case that the distance between the anode 1301 and the cathode 1302 is constant, energy of light emission obtained becomes higher than that obtained at the same amount of current when a light-emitting element includes only one electroluminescent layer. Therefore, oscillation efficiency of laser light can be improved.

The charge generation layer 1305 may be formed by a material that can transmit light. For example, a mixture of ITO, $V_2O_5$, and arylamine derivatives; a mixture of $MoO_3$ and arylamine derivatives; a mixture of $V_2O_5$ and F4TCNQ (tetrafluoro tetrathiafulvalene); or the like can be used.

In case that the anode 1301 and the cathode 1302 are used as reflectors, these electrodes are formed by selected materials to have a certain thicknesses, so that the reflectance of either of these electrodes becomes higher as much as possible and the transmittance of another electrode becomes approximately from 5 to 70%. In case that a reflector is formed separately, a material that can pass light through the anode 1301 or the cathode 1302 is selected. Further, the distance between reflectors is an integral multiple of a half-wavelength λ for resonating. A lamination structure of a light-emitting element is designed, so that light reflected by a reflector and a phase of newly generated light are corresponded to each other.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A light-emitting device comprising:

a first electrode having a concave portion;

an electroluminescent layer having a plane surface formed over the first electrode having a concave portion; and a second electrode formed over the plane surface so as to be overlapped with the concave portion, wherein the first electrode has a curved surface at the concave portion, wherein a focal distance f of a curvature of the concave portion and a distance L between a bottom of the curved surface of the first electrode and the plane surface of the electroluminescent layer satisfies a relationship expressed by formula (1):

$$f \geq L/2 \qquad (1),$$

wherein the second electrode has a plane surface, and wherein light generated in the electroluminescent layer is resonated between the first electrode and the second electrode and emitted as laser light through the second electrode.

2. A light-emitting device according to claim 1, wherein the light emitting device is incorporated into one of a laser pointer, projector, or a liquid crystal display device.

3. A light-emitting device comprising:

a first electrode having a concave portion;

an electroluminescent layer having a plane surface formed over the first electrode having a concave portion; and a second electrode formed over the plane surface so as to be overlapped with the concave portion, wherein the first electrode has a curved surface at the concave portion, wherein a focal distance f of a curvature of the concave portion and a distance L between a bottom of the curved surface of the first electrode and the plane surface of the electroluminescent layer satisfies a relationship expressed by formula (1):

$$f \geq L/2 \qquad (1),$$

wherein the electroluminescent layer includes at least a light-emitting layer and a hole injecting layer formed between the first electrode and the light-emitting layer, wherein the second electrode has a plane surface, and wherein light generated in the electroluminescent layer is resonated between the first electrode and the second electrode and emitted as laser light through the second electrode.

4. A light-emitting device according to claim 3, wherein the hole injecting layer comprises a high molecular organic compound.

5. A light-emitting device according to claim 4, wherein the high molecular organic compound is PEDOT.

6. A light-emitting device according to claim 4, wherein the high molecular organic compound is formed by spin coating.

7. A light-emitting device according to claim 3, wherein the light emitting device is incorporated into one of a laser pointer, projector, or a liquid crystal display device.

* * * * *